United States Patent
Lin

(10) Patent No.: US 10,765,034 B2
(45) Date of Patent: Sep. 1, 2020

(54) SECURING UNIT AND BASE SEAT SECURING STRUCTURE

(71) Applicant: ASIA VITAL COMPONENTS CO., LTD., New Taipei (TW)

(72) Inventor: Sheng-Huang Lin, New Taipei (TW)

(73) Assignee: ASIA VITAL COMPONENTS CO., LTD., New Taipei (TW)

(*) Notice: Subject to any disclaimer, the term of this patent is extended or adjusted under 35 U.S.C. 154(b) by 12 days.

(21) Appl. No.: 16/384,939

(22) Filed: Apr. 16, 2019

(65) Prior Publication Data

US 2020/0236805 A1 Jul. 23, 2020

(30) Foreign Application Priority Data

Jan. 22, 2019 (TW) ................. 108102352

(51) Int. Cl.
*H05K 5/00* (2006.01)
*H05K 7/20* (2006.01)

(52) U.S. Cl.
CPC ....... *H05K 7/2049* (2013.01); *H05K 7/20409* (2013.01)

(58) Field of Classification Search
CPC ...... G06F 1/20; H05K 1/0201; H05K 1/0203; H05K 1/18; H05K 1/181; H05K 2201/066; H05K 2201/10598; H05K 7/20418; H05K 7/2039; H05K 7/2049; H05K 7/20409
USPC ................................ 361/704, 709
See application file for complete search history.

(56) References Cited

U.S. PATENT DOCUMENTS 6,392,889 B1 * 5/2002 Lee ............... H01L 23/4093
165/80.3

* cited by examiner

*Primary Examiner* — Mandeep S Buttar
(74) *Attorney, Agent, or Firm* — Demian K. Jackson; Jackson IPG PLLC

(57) ABSTRACT

A securing unit and a base seat securing structure. The base seat securing structure includes a base seat and multiple securing units. The base seat has a top side, a bottom side, multiple perforations and multiple securing holes formed through the base seat between the top side and the bottom side. The securing holes are positioned around the perforations. Each securing unit has a seat section disposed on the top side of the base seat and multiple connection sections. The seat section has a bore in communication with and corresponding to the perforation. The connection sections are disposed under a lower side of the seat section. One end of each connection section has one or multiple stopper end sections. The stopper end sections are passed through the corresponding securing holes to abut against the bottom side of the base seat.

10 Claims, 12 Drawing Sheets

SECURING UNIT AND BASE SEAT SECURING STRUCTURE

This application claims the priority benefit of Taiwan patent application number 108102352 filed on Jan. 22, 2019.

BACKGROUND OF THE INVENTION

1. Field of the Invention

The present invention relates generally to a securing unit and a base seat securing structure, and more particularly to a base seat securing structure, which is easy to assemble and detach and is convenient to operate.

2. Description of the Related Art

Various electronic components are mounted on an electronic apparatus for performing different works. In operation, these electronic components will generate high heat, especially the central processing unit or the other chips in charge of providing calculation function. Therefore, it is necessary to additionally apply heat dissipation component to the electronic component to dissipate the heat thereof so as to prevent the central processing unit or the other chips from burning out.

The often seen heat dissipation components include heat sink, vapor chamber, radiating fin assembly, etc. The heat dissipation component must be in tight contact with and attached to the heat source such as the central processing unit or the other chips without any gap therebetween so that no thermal resistance will hinder the heat from being conducted and dissipated. In general, the heat dissipation component is securely locked on the motherboard by means of threaded members. A nut member with inner thread is disposed on the heat dissipation component. A locking unit is passed through the motherboard from the other side thereof to screw into the nut member so as to secure the heat dissipation component on the motherboard. The nut member must be temporarily fixed on the heat dissipation component by means of a nut gasket so as to prevent the nut member from detaching from the heat dissipation component. The nut gasket is made of plastic material and has at least two extending posts. The extending posts are first passed through the perforations preformed on the heat dissipation component and then the free ends of the extending posts are fused at high temperature and flattened and deformed into stopper sections, whereby the extending posts are prevented from being extracted out so as to secure the nut gasket and the nut on the heat dissipation component.

However, in the above process, it is time-costing to fuse the extending posts at high temperature and wait for the cooling and shaping of the extending posts. Moreover, after fused at high temperature, the plastic material will floss to waste the working time and complicate the manufacturing process. In addition, it is impossible to rework the nut gasket.

It is therefore tried by the applicant to provide a securing unit and a base seat securing structure thereof to solve the problems existing in the conventional nut gasket.

SUMMARY OF THE INVENTION

It is therefore a primary object of the present invention to provide a securing unit and a base seat securing structure, which is easy to assemble and detach.

It is a further object of the present invention to provide a securing unit and a base seat securing structure, which is convenient to operate to save the assembling and detachment time.

It is still a further object of the present invention to provide a base seat securing structure, in which multiple securing units are connected on a base seat and can be easily assembled or detached.

To achieve the above and other objects, the base seat securing structure of the present invention includes a base seat and multiple securing units. The base seat has a top side, a bottom side, multiple perforations and multiple securing holes formed through the base seat between the top side and the bottom side. The securing holes are positioned around the corresponding perforations. Each securing unit has a seat section and multiple connection sections. The seat section is disposed on the top side of the base seat in alignment with the perforation. The seat section has a bore in communication with and corresponding to the perforation. The connection sections are disposed under a lower side of the seat section. One end of each connection section has one or multiple stopper end sections. The stopper end section or stopper end sections are passed through the corresponding securing holes to abut against the bottom side of the base seat. By means of the design of the base seat securing structure of the present invention, the securing units can be easily assembled on the base seat or detached therefrom. Moreover, the operation is facilitated to save the assembling and detaching time.

Still to achieve the above and other objects, the securing unit of the present invention includes a seat section and multiple connection sections. The seat section has an upper side, a lower side, a receiving space and a bore. The receiving space is formed on the seat section for receiving a mating member therein. The bore is formed through the seat section between the upper and lower sides of the seat section in communication with the receiving space. The bore is for a connection member to pass through and connect with the mating member. The connection sections are disposed under the lower side of the seat section. One end of each connection section has a stopper end section.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1A:
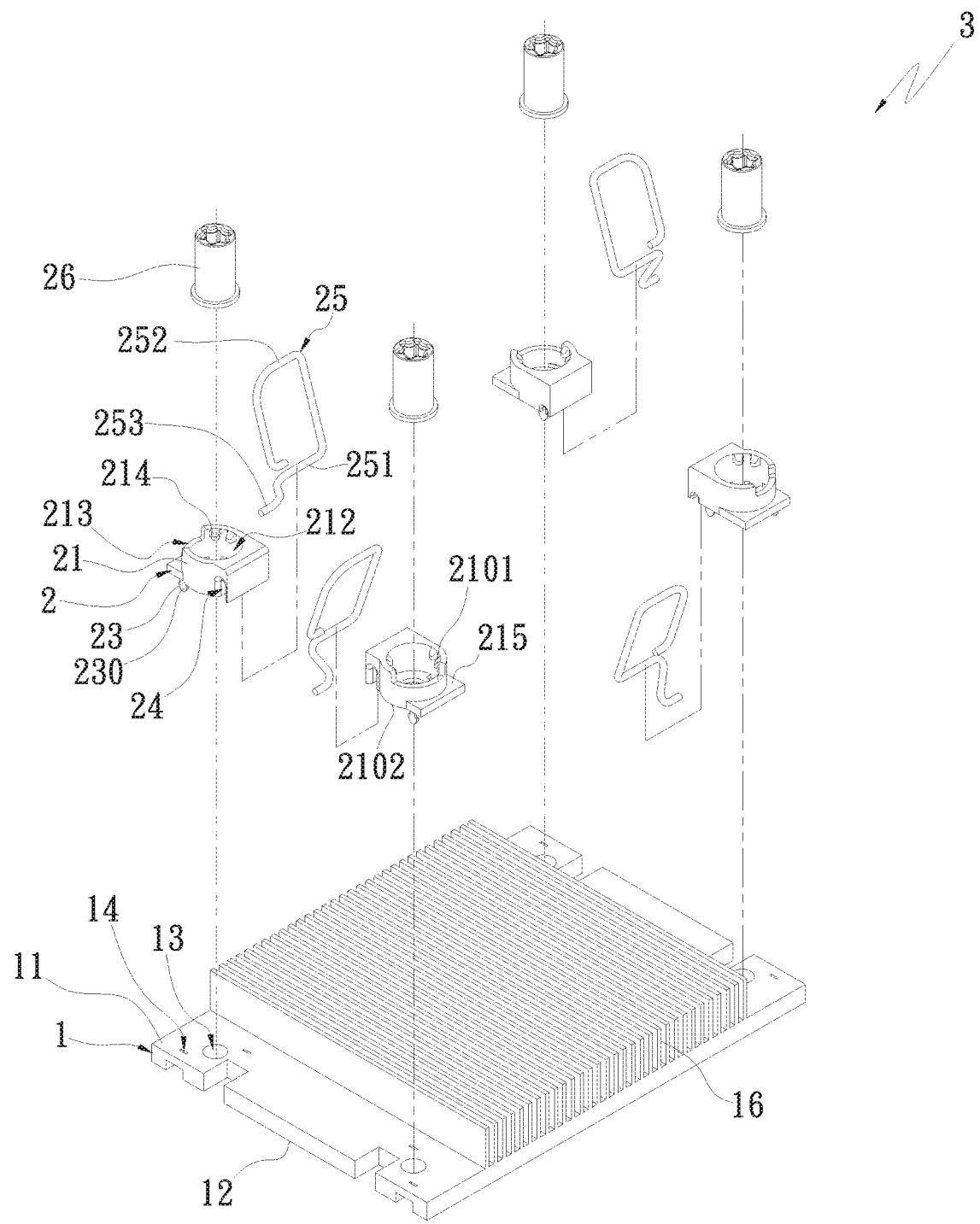
FIG. 1A is a perspective exploded view of a first embodiment of the present invention.
Figure 1B:
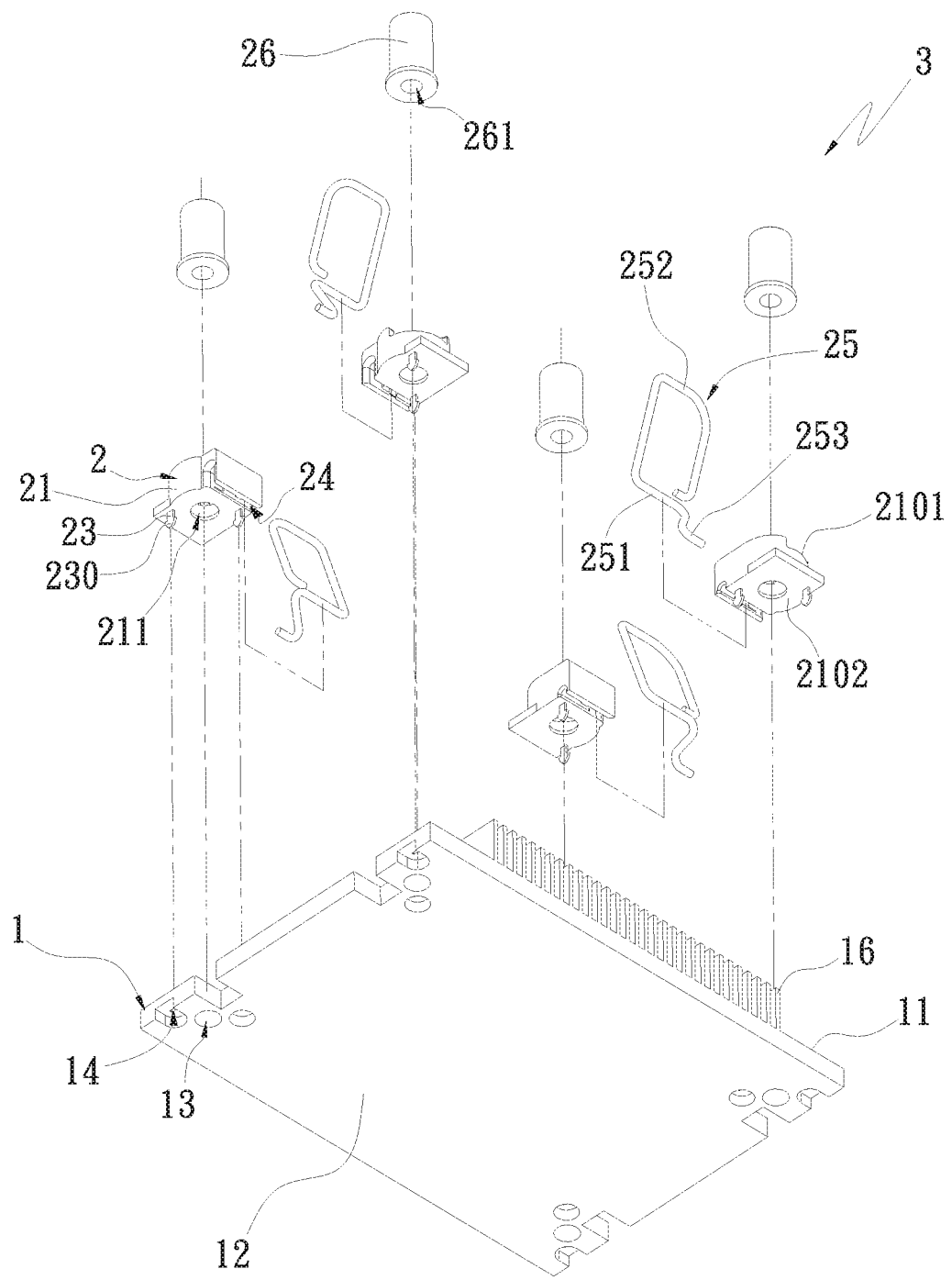
FIG. 1B is a perspective exploded view of the first embodiment of the present invention, seen from another angle.
Figure 2:
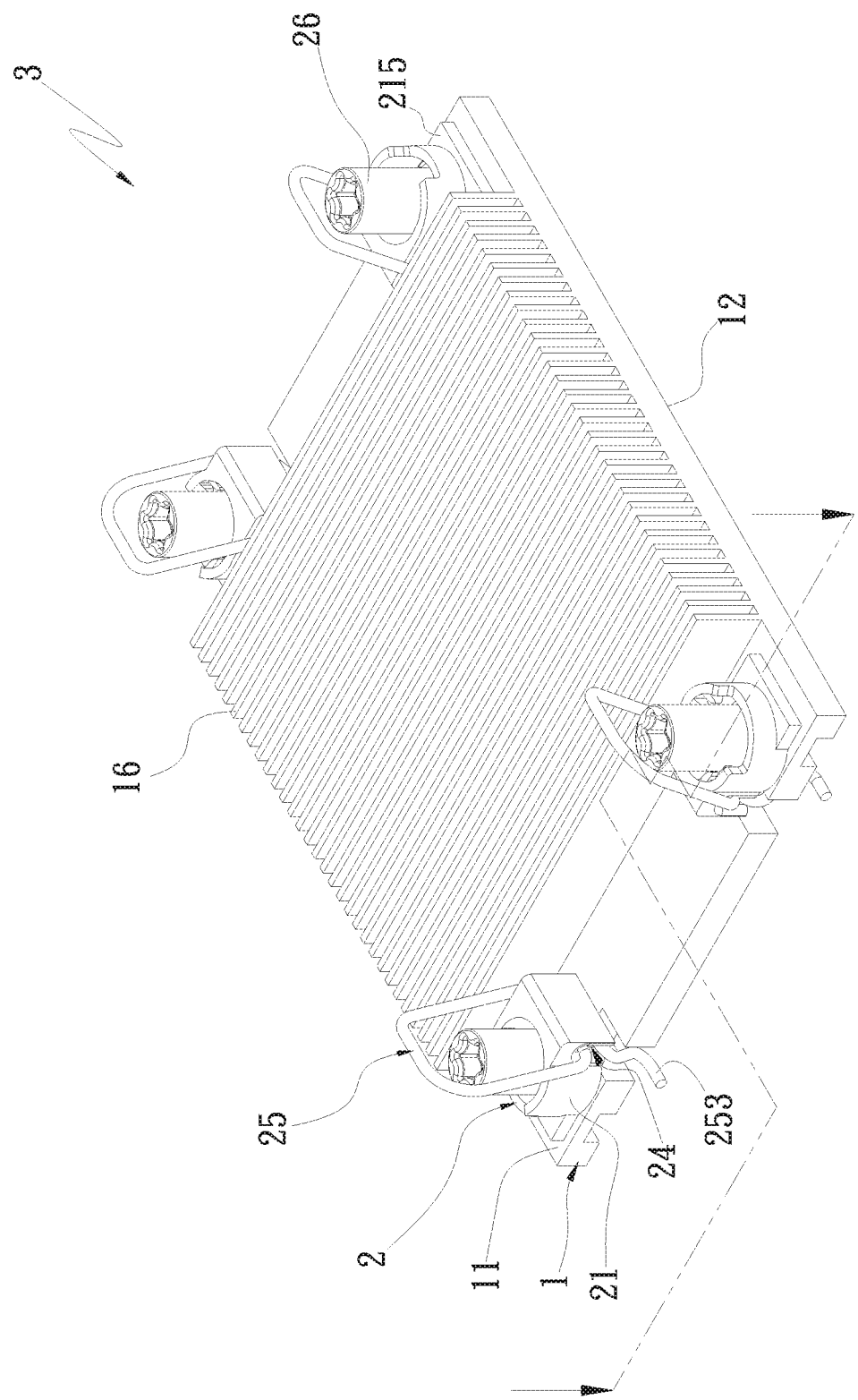
FIG. 2 is a perspective assembled view of the first embodiment of the present invention.
Figure 2A:
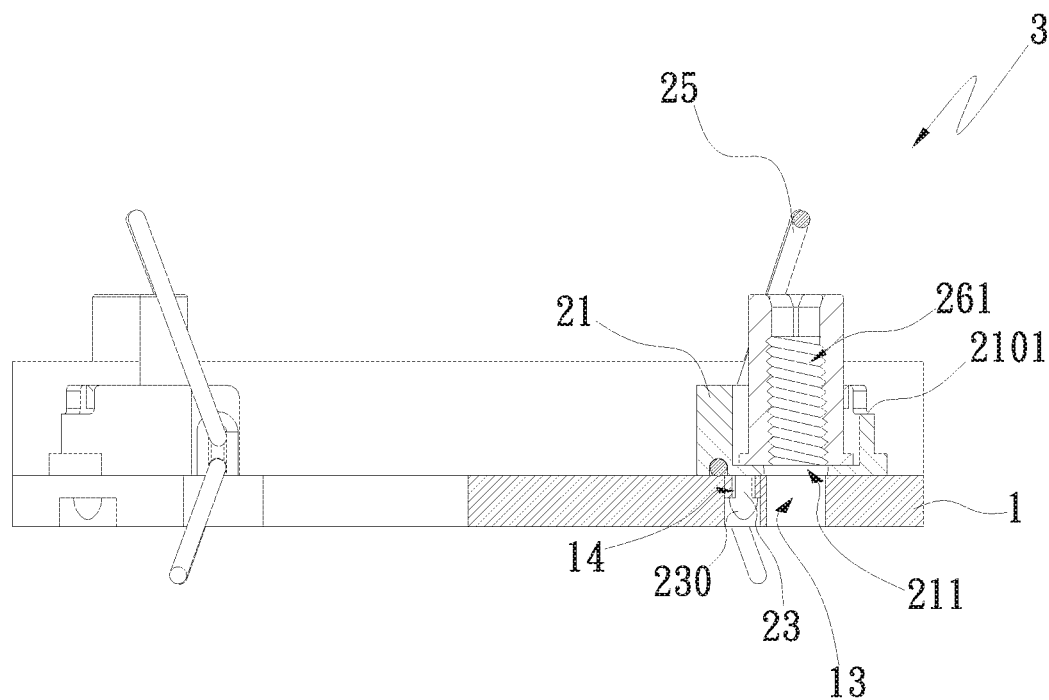
FIG. 2A is a partially sectional view of the first embodiment of the present invention.
Figure 2B:
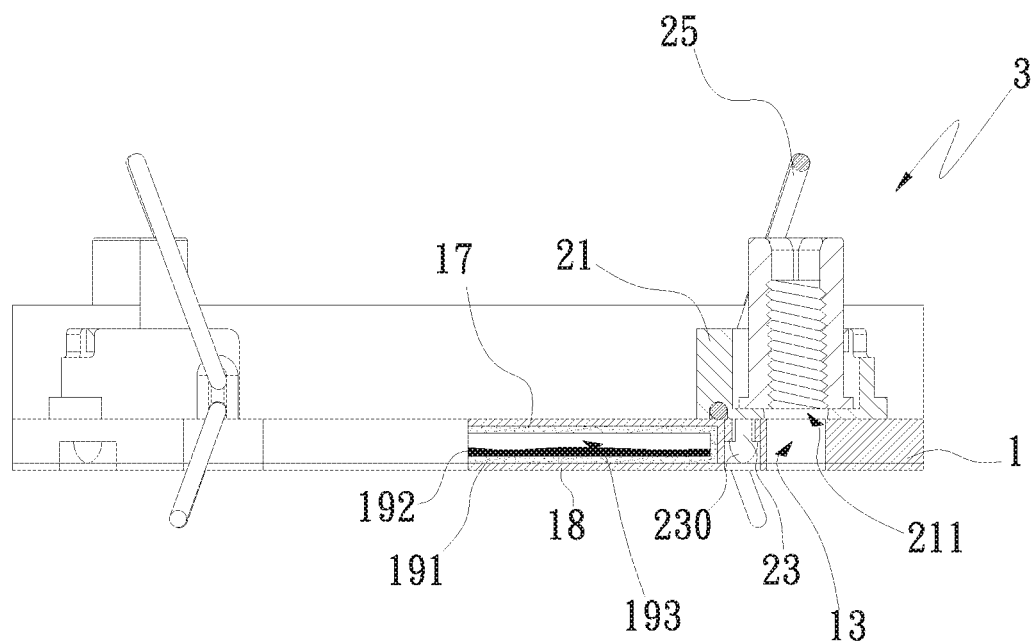
FIG. 2B is a partially sectional view of the first embodiment of the present invention, showing that the base seat is a vapor chamber.

Please refer to FIGS. 1A, 1B, 2, 2A and 2B. FIG. 1A is a perspective exploded view of a first embodiment of the present invention. FIG. 1B is a perspective exploded view of the first embodiment of the present invention, seen from another angle. FIG. 2 is a perspective assembled view of the first embodiment of the present invention. FIG. 2A is a partially sectional view of the first embodiment of the present invention. FIG. 2B is a partially sectional view of the first embodiment of the present invention, showing that the base seat is a vapor chamber. The base seat securing structure is applied to a solid base seat or a base seat with a chamber. The base seat is made of metal material (selected from a group consisting of gold, silver, copper, aluminum, stainless steel, titanium alloy and any combination thereof) or nonmetal material (plastic or polymer material). In this embodiment, the base seat securing structure is, but not limited to, applied to a base seat 1 having a top side 11. Multiple radiating fins are formed or latched on the top side 11 of the base seat 1 to form a heat sink 3. The base seat securing structure includes a base seat 1 and multiple securing units 2. The base seat 1 has a top side 11, a bottom side 12, multiple perforations 13 and multiple securing holes 14. The perforations 13 and the securing holes 14 are formed through the base seat 1 between the top side and the bottom side. The securing holes 14 are positioned around the corresponding perforations 13. In this embodiment, four perforations 13 are respectively formed through four corners of the base seat 1 and two securing holes 14 are formed beside each perforation 13. For example, referring to FIGS. 1A and 2, a perforation 13 is formed through the left upper corner of the base seat 1 and two securing holes 14 are cooperatively formed beside the perforation 13. The left lower corner, the right upper corner and the right lower corner of the base seat have the same arrangement of the perforations 13 and the securing holes 14. In practice, the securing units 2 of the present invention can be connected onto the base seat 1 of any heat dissipation component (such as a vapor chamber, a heat plate, a roll bond evaporator or any heat dissipation device with two-phase fluid). Alternatively, the securing units 2 of the present invention can be connected onto an independent solid metal-made base seat 1. Multiple radiating fins can be selectively disposed on the top side 11 of the base seat 1. Alternatively, another independent heat sink can be disposed on and attached to the top side 11 of the base seat 1. The bottom side of the base seat 1 is directly attached to a heat source (such as a central processing unit or any component the heat of which needs to be dissipated). In a modified embodiment, the securing units 2 of the present invention are connected onto such as an aluminum extrusion base seat 1. Multiple heat pipes (not shown) are inlaid in the base seat 1 and multiple radiating fins are disposed on the top side of the base seat 1.

As shown in FIG. 2B as well as FIG. 1A, in a preferred embodiment, the base seat 1 can be such designed as to have a chamber 193. The base seat 1 is such as a vapor chamber (or heat plate) composed of an upper plate 17 and a lower plate 18 mated with each other. A working fluid 192 (such as pure water, methanol, a coolant or a gas) is filled in the chamber 193. In addition, at least one capillary structure 191 (such as a sintered powder body, a woven mesh, a fiber body, a channeled body or any combination thereof) is disposed in the chamber 193. The securing units 2 of the present invention are disposed on the four corners of the sealed sections of the outer periphery of the vapor chamber, (that is, the base seat 1). The seat sections 21 of the securing units 2 of the present invention are disposed on the corresponding multiple perforations 13 and the multiple securing holes 14 formed on the sealed sections of the outer periphery of the vapor chamber, (that is, the sealed sections of the top side 11 of the upper plate 17 of the vapor chamber). Moreover, multiple radiating fins 16 can be selectively disposed on the top side 11 of the upper plate 17 of the vapor chamber. Alternatively, the top side 11 can be free from the radiating fins 16. The aforesaid sealed sections of the vapor chamber have no capillary structure or working fluid inside so that the sealed sections are also so-called void ends without vapor-liquid circulation.

In this embodiment, each securing unit 2 is a screw (nut) holder made of plastic material. Each securing unit 2 has a seat section 21 and multiple connection sections 23. The seat section 21 is disposed on the top side 11 of the base seat 1 in alignment with the perforation 13. In this embodiment, there are four seat sections 21. The lower sides of the four seat sections 21 are in contact with and attached to the top side 11 of the base seat 1 in alignment with the four perforations 13 on the four corners of the base seat 1. In practice, the number of the securing units 2 can be five and less than five in adaptation to the number of the perforations 13 (such as five or less than five) of the base seat 1. In order to facilitate illustration, the structure and connection relationship of the securing unit 2 disposed on the left upper corner of the base seat 1 will be described hereinafter, while the structure and connection relationship of the other three securing units 2 disposed on the left lower, right upper and right lower corners of the base seat 1 are the same and thus will not be redundantly described hereinafter. The seat section 21 of the securing unit 2 has an upper side 2101, a lower side 2102, a bore 211, a receiving space 212 in communication with the bore 211 thereon, an opening 213, a pivot slot 24, an elastic member 25, a lip edge 215 and multiple restriction end sections 214. The receiving space 212 is formed on the seat section 21 for receiving a mating member 26.

The bore 211 is formed through the seat section 21 between the upper and lower sides 2101, 2102 in communication with the perforation 13 of the base seat 1 right thereunder and the receiving space 212. A connection member (such as a screw or a bolt) is passed through the bore 211 to connect with the mating member 26. The opening 213 is formed on a sidewall of the seat section 21 in communication with the receiving space 212. The opening 213 is for the corresponding mating member 26 to horizontally displace from the opening 213 into the receiving space 212 or horizontally remove from the receiving space 212 through the opening 213 to outer side of the receiving space 212. In practice, the securing unit 2 can be alternatively made of metal material selected from a group consisting of iron, copper, aluminum, stainless steel, titanium and any alloy thereof. The lip edge 215 outward protrudes from an outer circumferential wall of the seat section 21 opposite to the opening 213.

The restriction end sections 214 protrude from two opposite inner sidewalls of the seat section 21 in the receiving space 212. In this embodiment, there are four restriction end sections 214 protruding from two opposite inner sidewalls of the seat section 21 in adjacency to the upper side of the seat section 21 into the receiving space 212. The restriction end sections 214 serve to restrict the axial displacement of the mating member 26 between the restriction end sections 214 in the receiving space 212 and the lower side of the seat section 21 so as to prevent the mating member 26 from detaching out of the seat section 21 from the top side 11 thereof. In this embodiment, there are four mating members 26 having a substantially elongated cylindrical configuration (such as four nuts with elongated cylindrical configuration). The four mating members 26 are received in the receiving spaces 212 of the four corresponding seat sections 21. Each mating member 26 is formed with a mating hole 261 in communication and alignment with the bore 211. In this embodiment, an inner thread is formed on an inner circumference of the mating hole 261, whereby the connection member 432 (such as a bolt) formed with an outer thread can be screwed and securely locked in the mating hole 261.

The pivot slot 24 is formed on an outer circumference of the seat section 21 of the securing unit 2. The elastic member 25 has a pivoted section 251, an operation section 252 and an engagement section 253. The operation section 252 extends from one end of the pivoted section 251 to a position corresponding to the pivot slot 24. The operation section 252 has a free end pivotally connected in the pivot slot 24. The engagement section 253 outward extends from the other end of the pivoted section 251. The connection sections 23 are disposed under the lower side of the seat section 21. In this embodiment, there are two connection sections 23 oppositely disposed under the lower side of each seat section 21. One end of each connection section 23 has one or multiple stopper end sections 230. In this embodiment, one end of each connection section 23 has one stopper end section 230 substantially having the form of a mushroom head (or an anchor). The stopper end sections 230 of the connection sections 23 are passed through the corresponding securing holes 14 beside of the perforation 13 on the left upper corner of the base seat 1. Then the stopper end sections 230 of the connection sections 23 outward protrude from the bottom side 12 of the base seat 1 through the corresponding securing holes 13 to abut against the bottom side 12 of the base seat 1 in adjacency to the perforation 13. When it is desired to detach the securing unit 2 from the base seat 1, an upward force is directly applied to the seat section 21 of the securing unit 2, whereby the stopper end sections 230 of the connection sections 23 of the seat section 21 are extracted out of the corresponding securing holes 14 from the bottom side 12 of the base seat 1 to the upper side of the top side 11 of the base seat 1 so as to detach the securing unit 2 from the base seat 1. Therefore, it is easy and convenient to assemble the securing unit 2 with the base seat 1 and detach the securing unit 2 from the base seat 1.

Figure 3:
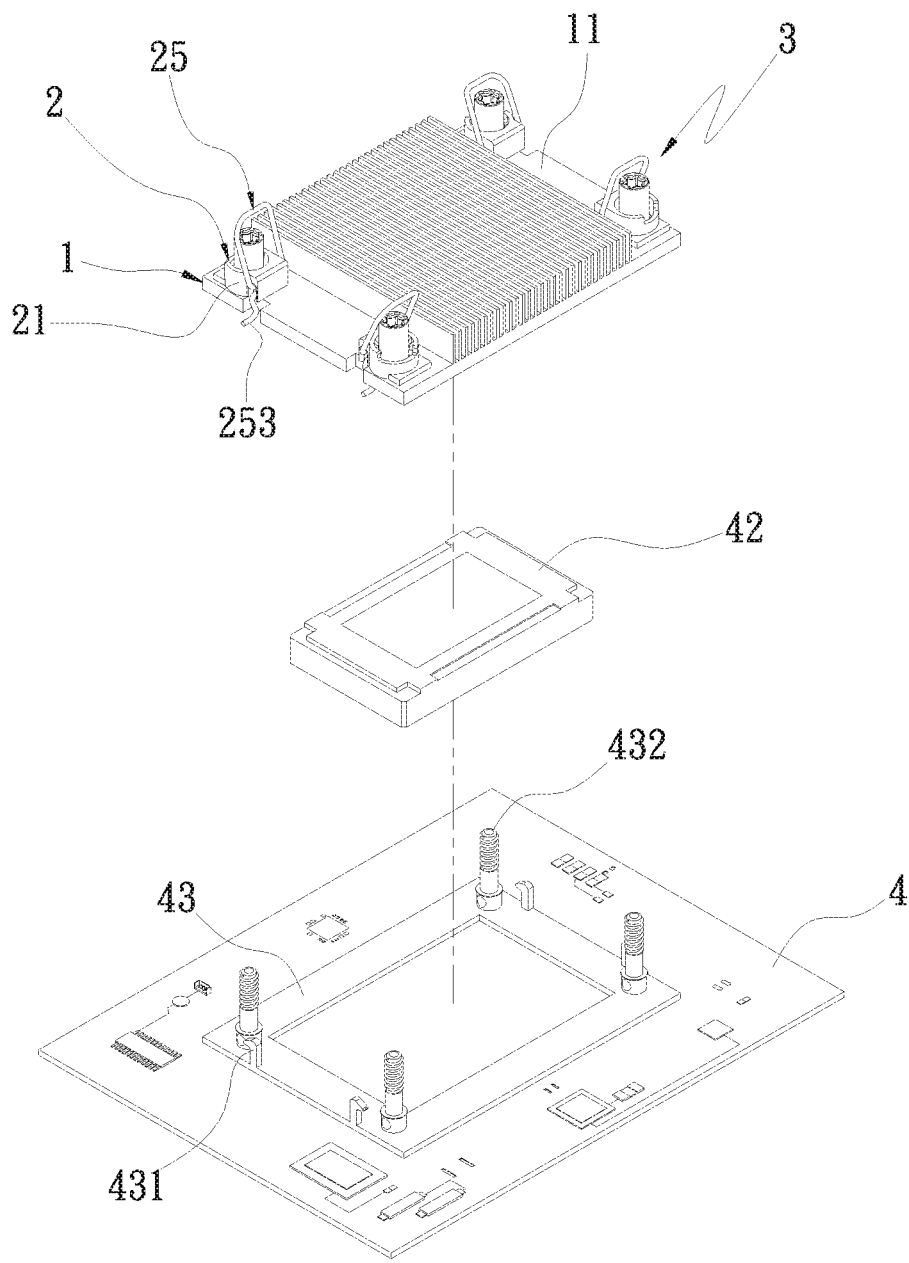
FIG. 3 is a perspective exploded view of the first embodiment of the present invention, showing the application thereof.
Figure 4:
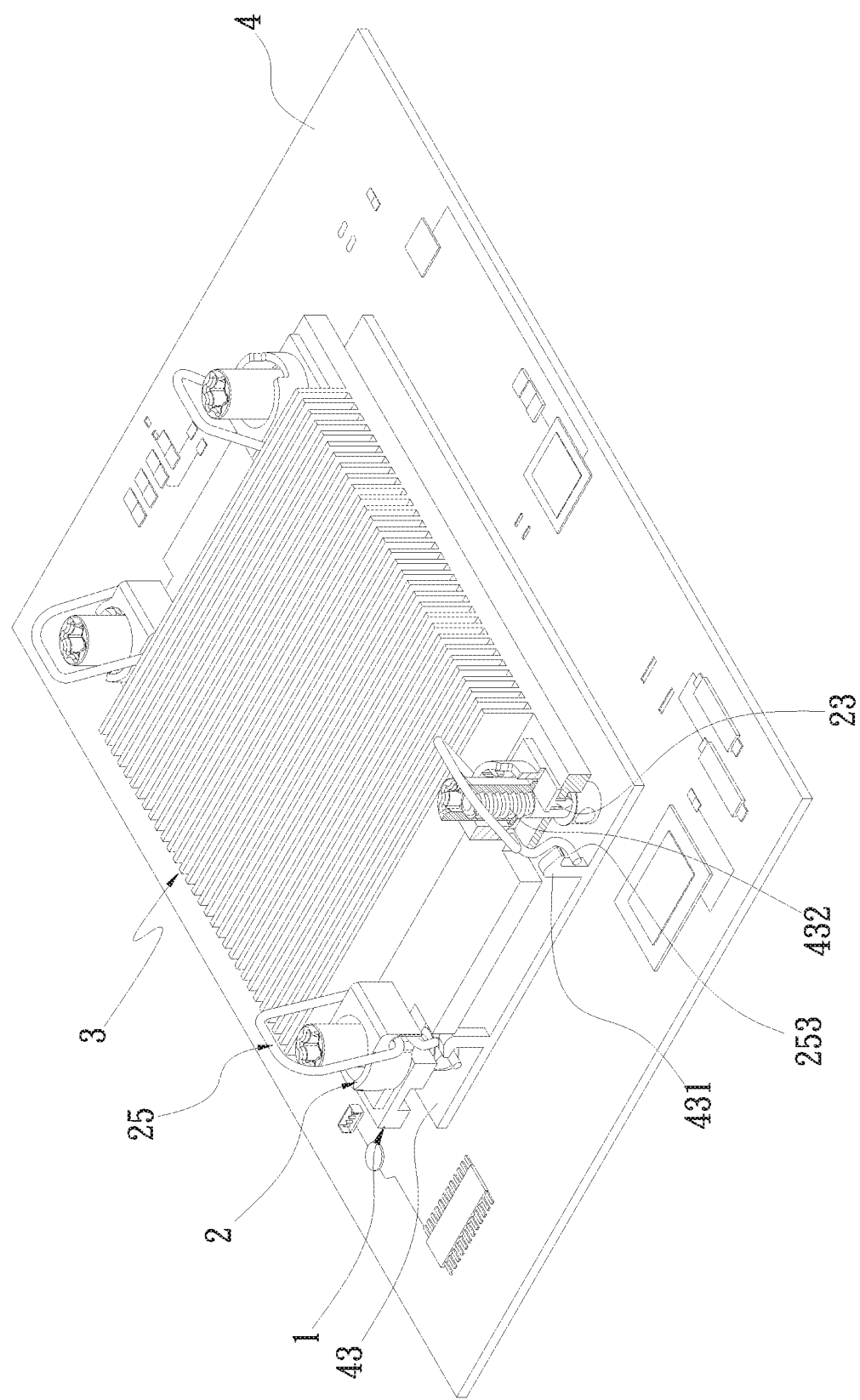
FIG. 4 is a perspective assembled and partially sectional view of the first embodiment of the present invention, showing the application thereof.
Figure 4A:
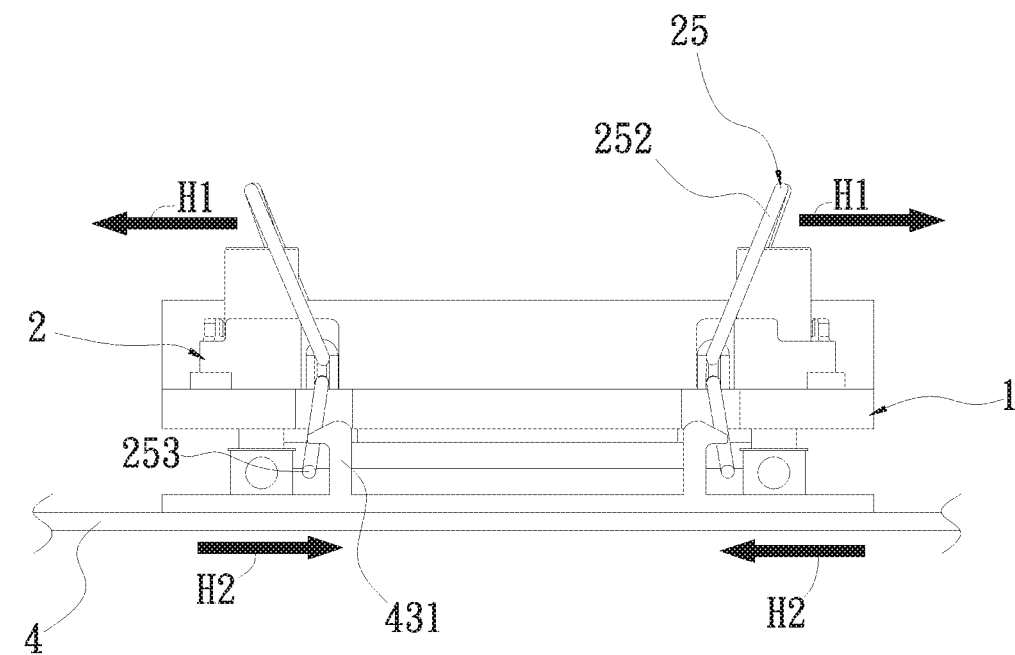
FIG. 4A is a side view of the first embodiment of the present invention, showing the assembling process thereof.
Figure 4A:
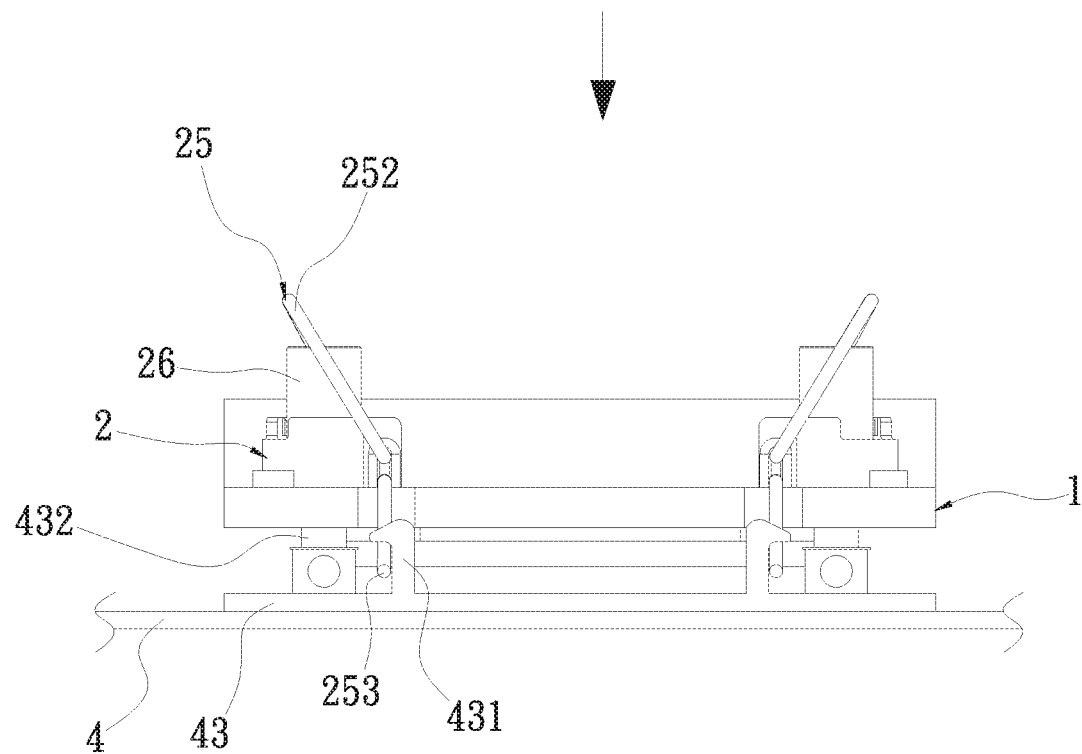
Figure 4B:
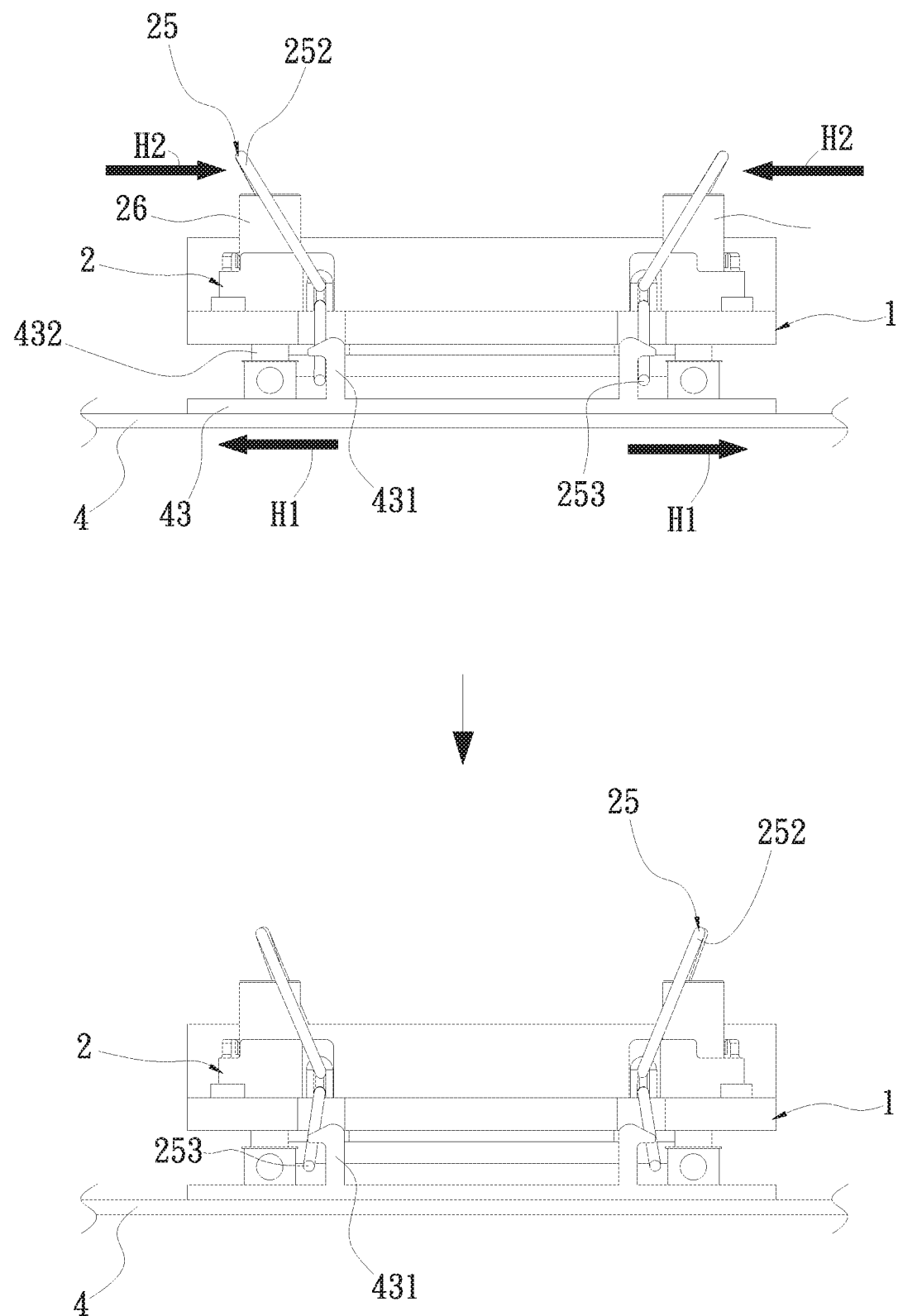
FIG. 4B is a side view of the first embodiment of the present invention, showing the detachment process thereof.

Please now refer to FIGS. 3, 4, 4A and 4B. FIG. 3 is a perspective exploded view of the first embodiment of the present invention, showing the application thereof. FIG. 4 is a perspective assembled and partially sectional view of the first embodiment of the present invention, showing the application thereof. FIG. 4A is a side view of the first embodiment of the present invention, showing the assembling process thereof. FIG. 4B is a side view of the first embodiment of the present invention, showing the detachment process thereof. Also referring to FIGS. 1A and 2A, the securing units 2 of the present invention are disposed on the base seat 1 of a heat sink 3 and applied to a heat generation component 42 (such as a central processing unit (CPU) or a graphics processing unit (GPU)) of a circuit board 4 (such as a motherboard, a display card circuit board or any other circuit board with electronic components thereon) of an electronic apparatus (such as a computer, a notebook or a communication device). A base seat frame body 43 is disposed on the circuit board 4. The heat generation component 42 is framed by the base seat frame body 43. Multiple engagement hooks 431 and multiple connection members 432 are disposed on the base seat frame body 43. The engagement hooks 431 are disposed on the upper side of the base seat frame body 43. Each engagement hook 431 is engaged with the corresponding engagement section 253 of the seat section 21 of the securing unit 2 to prevent the heat sink 3 from displacing. In this embodiment, each connection member 432 is a bolt. The bolts are disposed on four corners of the base seat frame body 43 corresponding to the perforations 13 on the four corners of the base seat 1. The bolts (the connection members 432) are passed through the corresponding perforations 13 of the base seat 1 and the bores 211 to screw into the mating holes 261 of the mating members 26, whereby the bolts are locked with the corresponding mating members 26 so as to securely connect the heat sink 3 on the base seat frame body 43 with the bottom side 12 of the base seat 1 tightly attached to the heat generation component 42.

Therefore, when the heat sink 3 connected with the securing units 2 of the present invention is mounted on the circuit board 4 (such as the motherboard of a computer), the four bolts (the four connection members 432) on the base seat frame body 43 are correspondingly fitted through the four perforations 13 of the base seat 1 of the heat sink 3. Then the operation sections 252 of the elastic members 25 of the seat sections 21 on the four corners are forced in a first direction H1, which is directed rearward (or in a direction away from the center of the base seat 1 as shown in FIG. 4A). At this time, the engagement sections 253 of the elastic members 25 are moved in a second direction H2 reverse to the first direction H1, which is directed forward (or in a direction to the center of the base seat 1 as shown in FIG. 4A) until the engagement sections 253 are engaged with the corresponding engagement hooks 431 of the base seat frame body 43. Then, by means of a locking tool such as a screwdriver (not shown), the mating members 26 on the four corners are clockwise tightened onto the bolts on the base seat frame body 43, whereby the bottom side 12 of the base seat 1 are tightly attached to the heat generation component 42.

When it is desired to detach the heat sink 3 from the base seat frame body 43 of the circuit board 4, by means of the locking tool, the mating members 26 on the four corners are counterclockwise untightened and loosened from the bolts (the connection members 432) on the base seat frame body 43. Then, the operation sections 252 of the elastic members 25 of the seat sections 21 on the four corners are forced in the second direction H2 (as shown in FIG. 4B). At this time, the engagement sections 253 of the elastic members 25 are moved in the first direction H1 reverse to the second direction H2 (as shown in FIG. 4B) until the engagement sections 253 of the elastic members 25 are disengaged from the corresponding engagement hooks 431 of the base seat frame body 43. Then the heat sink 3 can be directly detached from the base seat frame body 43.

In a modified embodiment, the pivot slot 24 and the elastic member 25 of each securing unit 2 can be omitted.

Accordingly, by means of the structural design of the securing unit 2 and the base seat 1 of the present invention, the securing unit 2 can be easily and conveniently assembled on the base seat 1 or detached therefrom to save the assembling and detaching time. Moreover, when the heat sink 3 connected with the securing units 2 of the present invention is applied to the circuit board 4 of the electronic apparatus, the operation is facilitated and the heat sink 3 can be quickly assembled with or detached from the circuit board 4.

Figure 5:
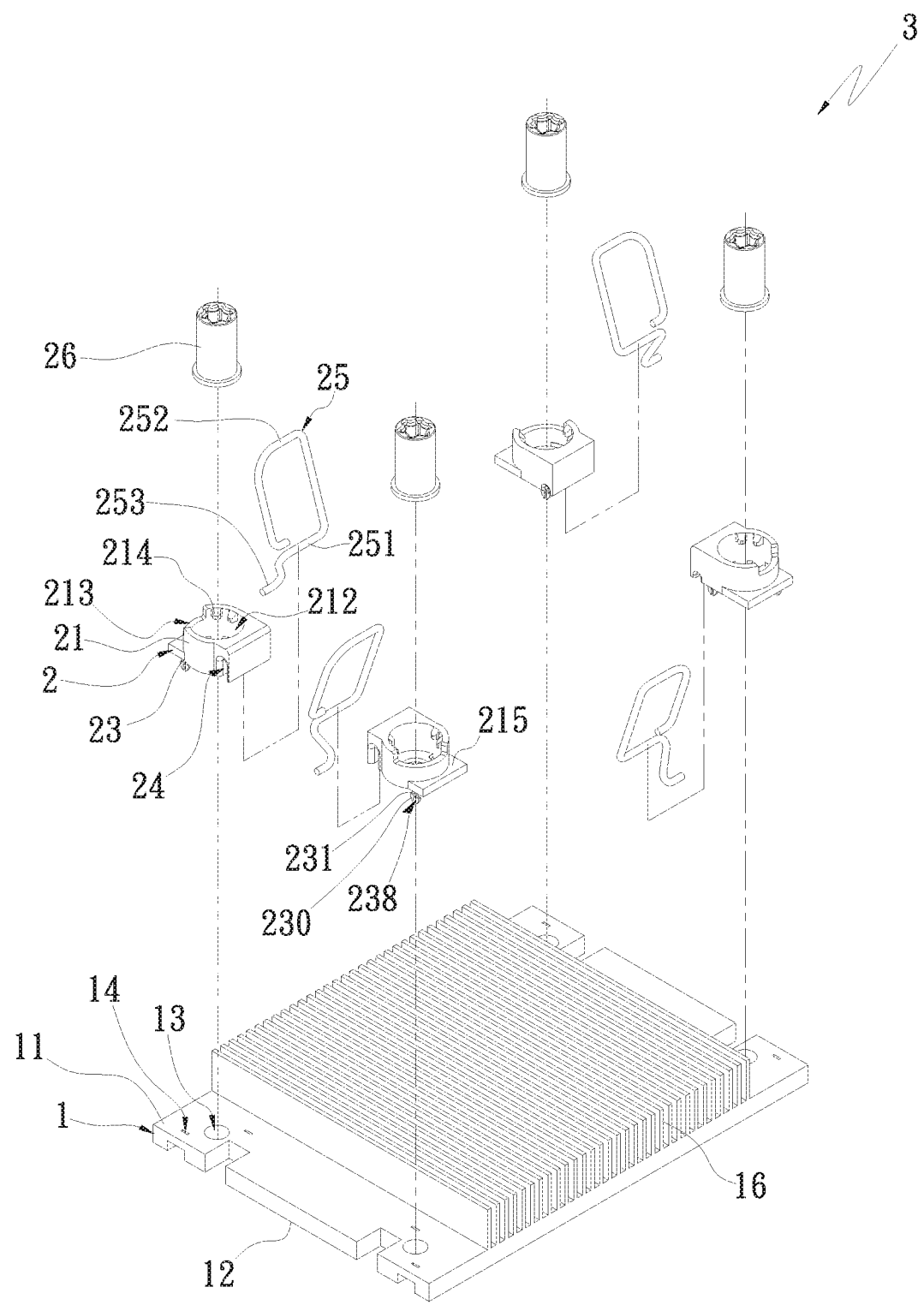
FIG. 5 is a perspective exploded view of a second embodiment of the present invention.
Figure 6A:
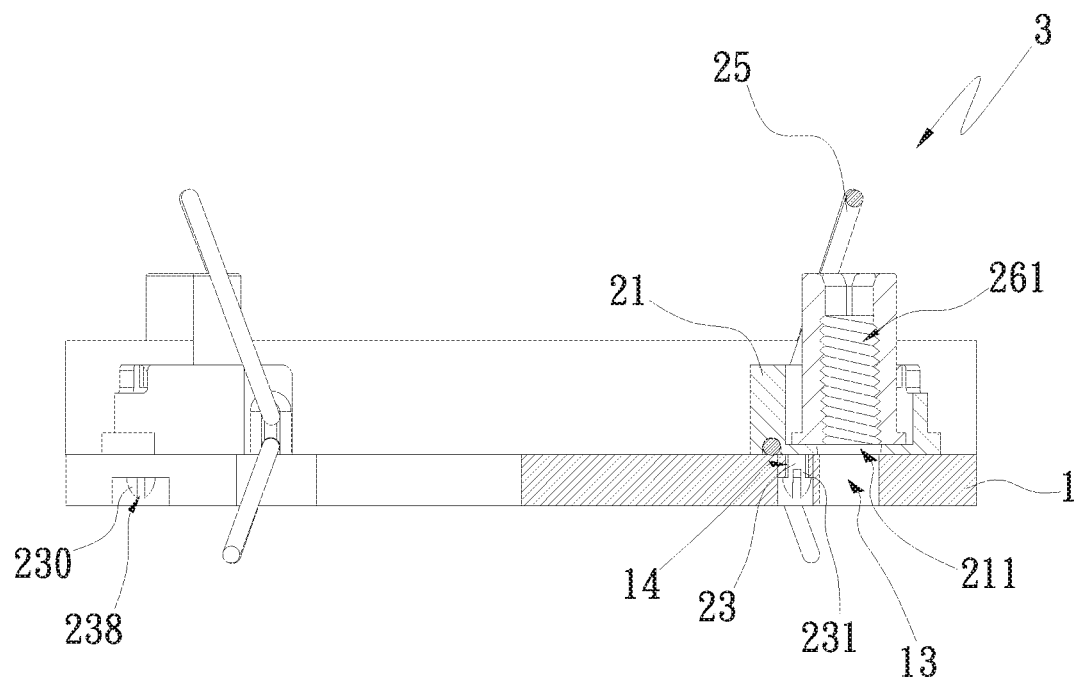
FIG. 6A is a partially sectional view of the second embodiment of the present invention.
Figure 6B:
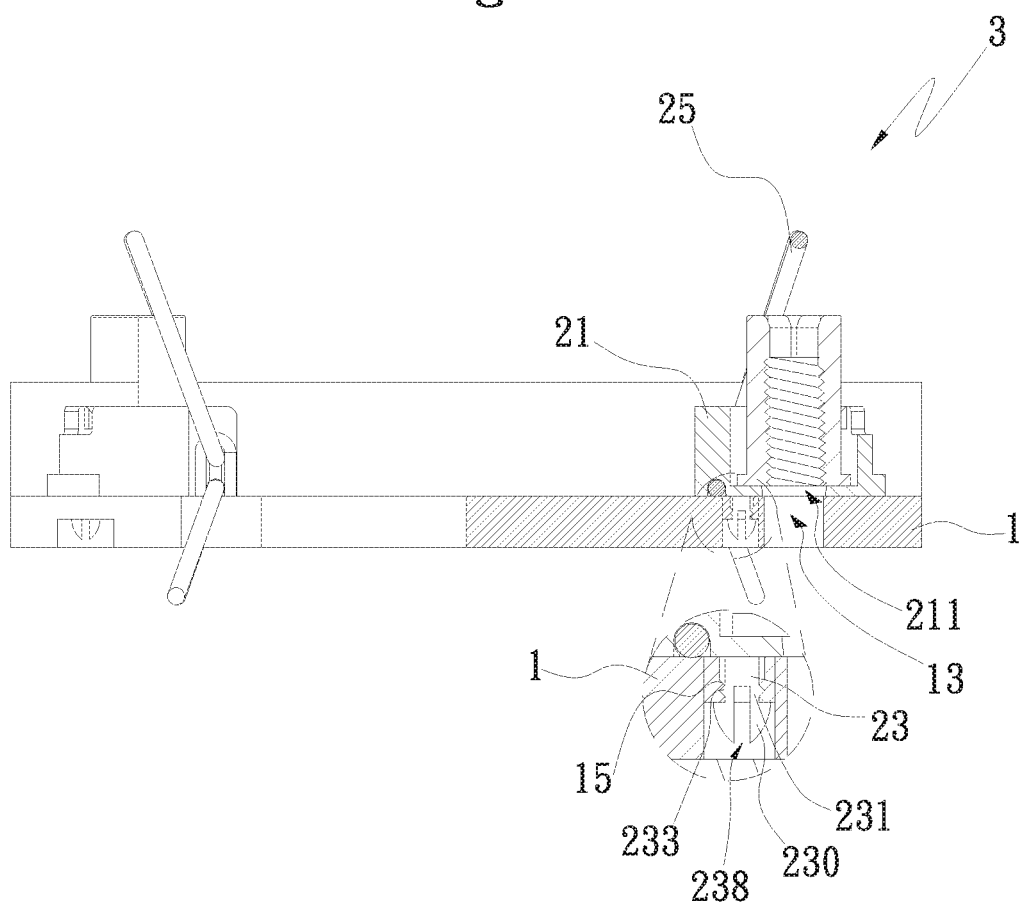
FIG. 6B is a partially sectional view of the second embodiment of the present invention, showing that each extension arm has an outer surface boss body.

Please now refer to FIGS. 5, 6A and 6B. FIG. 5 is a perspective exploded view of a second embodiment of the present invention. FIG. 6A is a partially sectional view of the second embodiment of the present invention. FIG. 6B is a partially sectional view of the second embodiment of the present invention, showing that each extension arm has an outer surface boss body. Also referring to FIG. 2, the structure, connection relationship and effect of the second embodiment are substantially identical to those of the first embodiment and thus will not be redundantly described hereinafter. The second embodiment is different from the first embodiment in that the connection section 23 of each securing unit 2 has multiple extension arms 231. The extension arms 231 define therebetween a contractible space 238, whereby the extension arms 231 can be elastically displaced within the contractible space 238. In this embodiment, there are two extension arms 231. The stopper end sections 230 form a free end of the two extension arms 231. The stopper end sections 230 of the connection sections 23 pass through the corresponding securing holes 14 beside the perforation 13 and outward protrude from the bottom side 12 of the base seat 1 to respectively abut against the bottom side 12 of the base seat 1. For example, when the stopper end sections 230 of the two extension arms 231 of the connection sections 23 of the securing unit 2 disposed on the left lower corner pass through the two corresponding securing holes 14 in adjacency to the left lower corner of the base seat 1, the extension arms 231 of the connection sections 23 and the stopper end sections 230 thereof will bear an inward compression force to elastically deform and displace into the contractible space 238 until the stopper end sections 230 of the connection sections 23 extend out of the bottom side 12 of the base seat 1. At this time, the extension arms 231 and the stopper end sections 230 thereof are outward released from the contractible space 238 and uncompressed to elastically restore to their home positions, whereby the stopper end sections 230 of the connection sections 23 respectively abut against the bottom side 12 of the base seat 1 in adjacency to the two corresponding securing holes 14 on the left lower corner. Therefore, by means of the design that the extension arms 231 can be elastically displaced within the contractible space 238, the assembling and detachment processes are facilitated and speeded.

In a modified embodiment as shown in FIG. 6B, each extension arm 231 has an outer surface boss body 233 positioned above the stopper end section 230 in adjacency to the stopper end section 230. Two opposite recesses 15 are formed on inner wall of each securing hole 14 of the base seat 1. For example, the outer surface boss bodies 233 of the connection sections 23 on the left lower corner are inserted in the recesses 15 formed on the inner wall of the corresponding securing holes 14 on the left lower corner of the base seat 1. The outer surface boss bodies 233 of the extension arms 231 are connected in the recesses 15 formed on the inner wall of the securing holes 14 of the base seat 1 so that the securing unit 2 can be more securely connected with the base seat 1.

Figure 7:
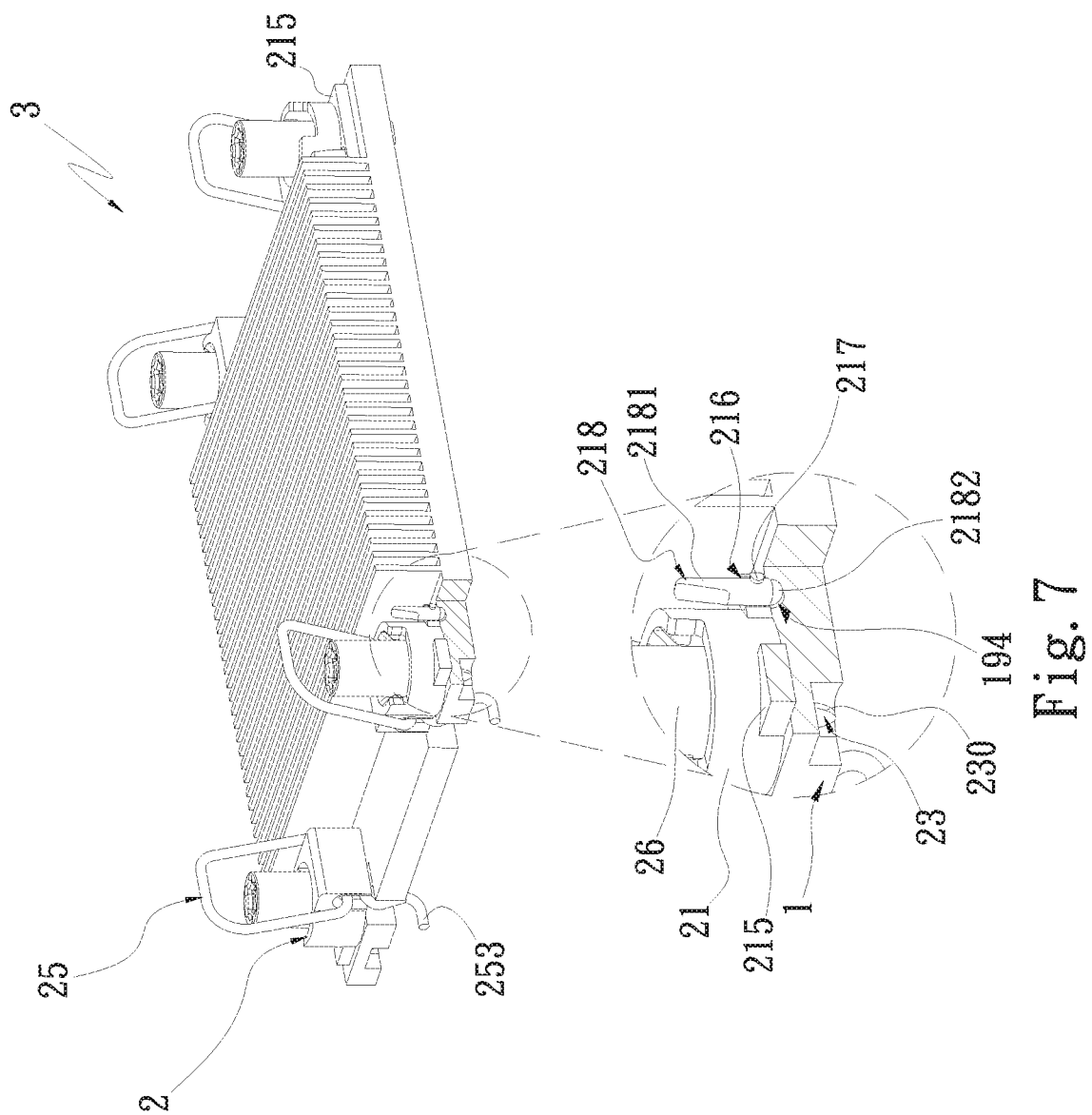
FIG. 7 is a perspective assembled and partially sectional view of a third embodiment of the present invention.
Figure 7A:
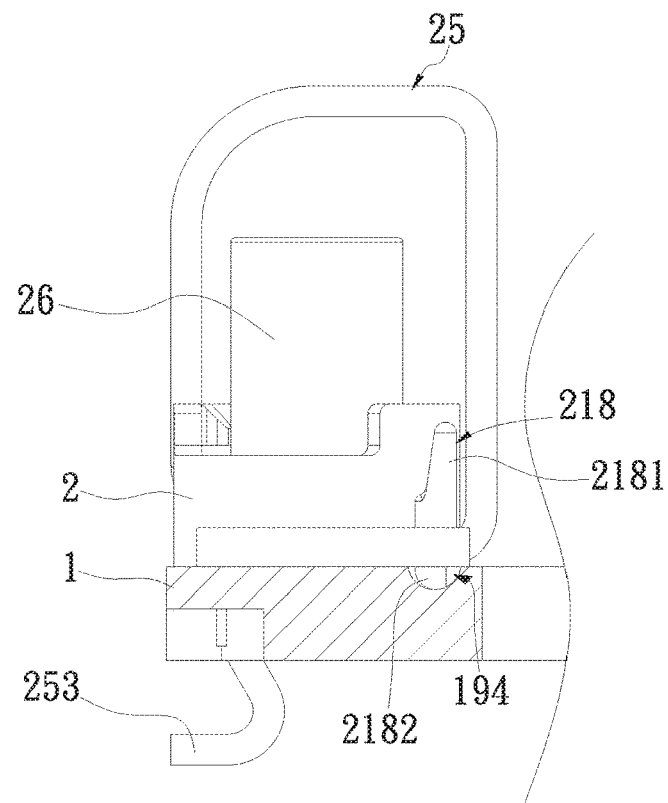
FIG. 7A is a side partially sectional view of the third embodiment of the present invention, showing that the operation lever of the securing unit is engaged with the base seat.
Figure 7B:
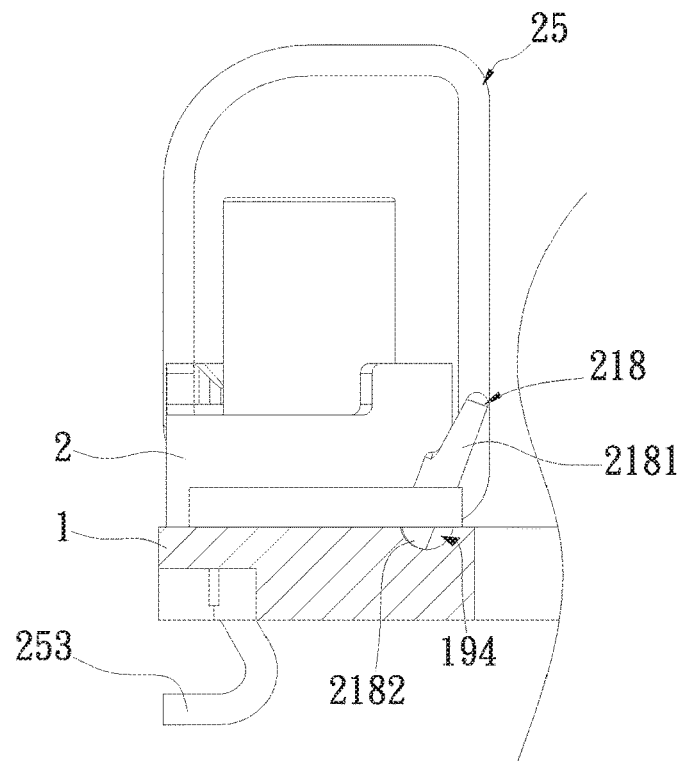
FIG. 7B is a side partially sectional view of the third embodiment of the present invention, showing that the operation lever of the securing unit is to disengage from the base seat.

Please now refer to FIGS. 7, 7A and 7B. FIG. 7 is a perspective assembled and partially sectional view of a third embodiment of the present invention. FIG. 7A is a side partially sectional view of the third embodiment of the present invention, showing that the operation lever of the securing unit is engaged with the base seat. FIG. 7B is a side partially sectional view of the third embodiment of the present invention, showing that the operation lever of the securing unit is to disengage from the base seat. Also referring to FIGS. 1A and 2, the structure, connection relationship and effect of the third embodiment are substantially identical to those of the first embodiment and thus will not be redundantly described hereinafter. The third embodiment is different from the first embodiment in that a through hole 216 is formed on the lip edge 215 of the seat section 21 of each securing unit 2. Two opposite support end sections 217 are disposed on the lip edge 215 and an operation lever 218 is movably disposed in the through hole 216. The through hole 216 is formed through the lip edge 215. The support end sections 217 extend from the inner sidewall of the lip edge 215 to connect with an outer circumference of the corresponding operation lever 218 positioned in the through hole 216. The operation lever 218 has an operation end 2181 and an engagement end 2182. The operation end 2181 is positioned right above the through hole 216 of the seat section 21. The engagement end 218 outward protrudes from the lower side of the seat section 21. A lateral side of the engagement end 2182 is formed with a semicircular recessed contact face. In practice, the contact face of the engagement end 2182 can have the form of a full circle, a slope, an arched face or any other configuration (such as elliptic configuration).

The base seat 1 has multiple connection sections 194. In this embodiment, there are four connection sections 194, which are four dents formed on the base seat 1 corresponding to the engagement ends 2182 of the operation levers 218 of the four seat sections 21. The engagement ends 2182 can be engaged in or disengaged from the corresponding dents (the connection sections 194) of the base seat 1. For example, when the stopper end sections 230 of the connection sections 23 of the seat sections 21 abut against the bottom side 12 of the base seat 1 in adjacency to the perforations 13, the contact faces of the engagement ends 2182 of the operation levers 218 of the seat sections 21 are in contact with and inlaid in (or engaged in) the corresponding dents of the base seat 1 (as shown in FIG. 7A). When the stopper end sections 230 of the connection sections 23 of the seat sections 21 are detached from the bottom side 12 of the base seat 1 in adjacency to the perforations 13, the operation ends 2181 of the operation levers 218 of the seat sections 21 are forced outward to make the contact faces of the engagement ends 2182 of the operation levers 218 of the seat sections 21 displace upward along the corresponding dents (the connection sections 194) of the base seat 1 (as shown in FIG. 7B) so as to detach the seat sections 21 from the base seat 1.

In a modified embodiment, the connection sections 194 are raised block bodies such as four raised block bodies disposed and formed on the base seat 1 corresponding to the engagement ends 2182 of the operation levers 218 of the four seat sections 21. The engagement ends 2182 can be engaged with or disengaged from the corresponding raised block bodies (the connection sections 194) of the base seat 1.

The present invention has been described with the above embodiments thereof and it is understood that many changes and modifications in such as the form or layout pattern or practicing step of the above embodiments can be carried out without departing from the scope and the spirit of the invention that is intended to be limited only by the appended claims.

What is claimed is:

1. A base seat securing structure comprising:
a base seat having a top side, a bottom side, multiple securing holes and multiple perforations, the perforations and the securing holes being formed through the base seat between the top side and the bottom side, the securing holes being positioned around the corresponding perforations; and
multiple securing units each having a seat section and multiple connection sections, the seat section being disposed on the top side of the base seat in alignment with the perforation, the seat section having a bore in communication with and corresponding to the perforation, the connection sections being disposed under a lower side of the seat section, one end of each connection section having one or multiple stopper end sections, the stopper end section or stopper end sections of the connection sections being passed through the corresponding securing holes to abut against the bottom side of the base seat.

2. The base seat securing structure as claimed in claim 1, wherein the perforations are formed through four corners of the base seat.

3. The base seat securing structure as claimed in claim 1, wherein the seat section has a receiving space in communication with the bore, an opening and multiple restriction end sections, the receiving space being for receiving a mating member, the opening being formed on a sidewall of the seat section in communication with the receiving space, the restriction end sections protruding from two opposite inner sidewalls of the seat section in the receiving space, the mating member being formed with a mating hole in communication and alignment with the bore, a corresponding connection member being passed through and connected in the mating hole.

4. The base seat securing structure as claimed in claim 1, wherein each connection section has multiple extension arms, the extension arms define therebetween a contractible space, the stopper end sections forming a free end of the extension arms, the stopper end sections of the connection sections passing through the securing holes to respectively abut against the bottom side of the base seat.

5. The base seat securing structure as claimed in claim 4, wherein each extension arm has an outer surface boss body in adjacency to the stopper end section.

6. The base seat securing structure as claimed in claim 1, wherein the bottom side of the base seat is attached to a heat generation component of a circuit board.

7. The base seat securing structure as claimed in claim 1, wherein multiple radiating fins are disposed on the top side of the base seat, the radiating fins and the base seat together forming a heat sink.

8. The base seat securing structure as claimed in claim 1, wherein the base seat is a solid base seat made of metal material or a base seat formed with a chamber.

9. The base seat securing structure as claimed in claim 3, wherein the seat section has a lip edge, a through hole being formed on the lip edge, two opposite support end sections being disposed on the lip edge and an operation lever being movably disposed in the through hole, the through hole being formed through the lip edge, the support end sections extending from an inner sidewall of the lip edge to connect with an outer circumference of the corresponding operation lever positioned in the through hole, the operation lever having an operation end and an engagement end, the operation end being positioned above the through hole of the seat section, the engagement end outward protruding from the lower side of the seat section, the base seat having multiple connection sections, the connection sections being disposed on the base seat, whereby the engagement ends of the seat sections can be movably engaged with or disengaged from the corresponding connection sections.

10. A securing unit comprising:
a seat section, the seat section having an upper side, a lower side, a receiving space and a bore, the receiving space being formed on the seat section for receiving a mating member therein, the bore being formed through the seat section between the upper and lower sides of the seat section in communication with the receiving space, the bore being for a connection member to pass through and connect with the mating member; and
multiple connection sections disposed under the lower side of the seat section, one end of each connection section having a stopper end section.

* * * * *